United States Patent Office 3,144,331

Patented Aug. 11, 1964

3,144,331

PROCESS FOR CONDITIONING PHOTOPOLYMERIZABLE ELEMENTS

Glen Anthony Thommes, Middletown, N.J., assignor to E. I. du Pont de Nemours and Company, Wilmington, Del., a corporation of Delaware No Drawing. Filed Jan. 13, 1961, Ser. No. 82,413
11 Claims. (Cl. 96—27)

This invention relates to a process for improving the photospeed of photopolymerizable elements. More particularly, it relates to such a process whereby the oxygen concentration in addition-polymerizable elements is reduced to a low level. Still more particularly, it relates to a process whereby photopolymerizable plates for making printing reliefs which are saturated with absorbed oxygen are conditioned so that they acquire approximately their original photospeed.

Photopolymerizable compositions and elements as described in U.S. Patents Plambeck 2,760,863 and 2,791,504, Martin et al. 2,927,022, Martin 2,927,023 and Munger 2,923,673 are useful in the preparation of printing reliefs. These compositions, in addition to other photopolymerizable compositions to be described later, contain inter alia, addition polymerization initiators activatable by actinic radiation, addition polymerizable ethylenically unsaturated compounds, e.g., vinylidene and vinyl monomers, preferably of the acrylic or alkacrylic ester type and an organic polymer binding material. The rate of photopolymerization of such compositions in a layer of 3 to 250 mils in thickness has been found to be markedly inhibited or retared by absorbed molecular oxygen, e.g., oxygen in air. Satisfactory printing reliefs can be prepared despite oxygen inhibition by exposing photopolymerizable elements to greater amounts of actinic radiation. When the photopolymerizable elements having a thickness of 25 mils or more are added and the quantity of air which is present in the photopolymerizable layer is increased to the saturation point, the increased exposure to actinic radiation (i.e., wave lengths between 1200 and 7000 A. and generally between 3000 and 4300 A.) necessary to photopolymerize that portion of the photopolymerizable layer near the base of the element causes over-polymerization near the surface. The result is that the printing characters are plugged, particularly the fine characters, e.g., the center of an "o" or an "e."

A process for restoring photopolymerizable printing elements to their initial, inherent exposure speed levels is disclosed in assignee's Belgian Patent 586,714. The photopolymerizable elements are conditioned satisfactorily in an essentially inert atmosphere but such conditioning must be accomplished over a lengthy period of time.

An object of this invention is to provide a quick, simple, effective method of improving the photospeed of photopolymerizable element. Another object is to provide a process whereby photopolymerizable elements are restored to their initial, inherent exposure speed levels. Still another object is to provide a process which utilizes simple, readily available equipment. Still further objects will be apparent from the following detailed description.

According to this invention, it has been found that photopolymerizable elements for the formation of relief images, e.g., elements having a support and a relief height-forming solid stratum comprising (1) a preformed compatible macromolecular polymer binding agent, (2) a non-gaseous, addition-polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation, and (3) from 0.001 to 10% or more, by weight, of the stratum of such an initiator, after desensitization by absorbed oxygen, can be restored to their initial, inherent speed levels by exposing a surface of the solid photopolymerizable stratum to about 70% to about 98% of the actinic radiation impinging uniformly upon said surface necessary to initiate photopolymerization in said solid stratum. The resulting said element is then promptly subjected to image-wise exposure and the unexposed areas are removed as described in Plambeck U.S. Patent 2,760,863. In general, components (1), (2) and (3) are present in amounts from 40 to 90 parts, 10 to 60 parts and 0.0001 to 10.0 parts by weight, respectively. By using the restoring or photoconditioning treatment of this invention, the time required for exposure of the photopolymerizable layer to produce a satisfactory printing relief itself can be substantially reduced.

In exemplification of the invention, a photopolymerizable element having a relief height-forming addition-polymerizable stratum, 3 to 60 mils in thickness, preferably 10 to 60 mils in thickness, on a support bearing a suitable anchor layer, said stratum prepared from cellulose acetate hydrogen succinate; an addition-polymerizable ethylenically unsaturated compound, e.g., triethylene glycol diacrylate, an addition polymerization initiator activatable by actinic radiation, e.g., anthraquinone; and a thermal polymerization inhibitor, e.g., p-methoxyphenol, is stored so that air freely contacts said stratum until the photopolymerizable composition is saturated with oxygen (which generally occurs within 18 to 24 hours). The photopolymerizable element is then photoconditioned by exposing the element in air by means of an actinic radiation source, e.g., a mercury vapor or a carbon arc, to at least 70 percent of the actinic radiation required to initiate initial polymerization in a stratum of the photopolymerizable layer. Preferably, the amount of actinic radiation used in photoconditioning ranges from about 80 to 98.0 percent of the actinic radiation required to initiate initial polymerization in air.

A photopolymerizable element having a transparent support, e.g., a plastic support, can be photoconditioned in air by exposing the element through the base support to at least 70 percent of the actinic radiation required to initiate polymerization in the photopolymerizable layer as described above.

Photopolymerizable elements can also be photoconditioned while under conditions of reduced pressure, i.e., under reduced partial pressure of oxygen. Under these conditions, the source of actinic radiation must emit radiation of wavelengths that are not strongly absorbed by the photopolymerizable stratum or premature polymerization of the photopolymerizable layer will occur prior to complete photoconditioning. By way of illustration, a filtered actinic radiation source can be used to photocondition a photopolymerizable stratum, the filter, for example, being selected so that only the longest wavelengths within the actinic range of the photopolymerizable layer are transmitted. Those wavelengths below about 4000 A. can be eliminated by use of a Corning type 3–73 filter. For photoconditioning under reduced pressures, the photopolymerizable stratum can be exposed to radiation through the surface of the stratum or through a transparent base support. After photoconditioning, the regular unfiltered radiation source is then used to polymerize selected areas of the stratum.

In another embodiment of the invention, additional initiators, e.g., phenanthrenequinone or uranyl nitrate, can be placed in a stratum below the photopolymerizable layer, and the element exposed to an actinic radiation source for a predetermined period of time less than that required to cause initial polymerization. By using the added initiator, the elements can be conditioned at higher radiation intensities and for shorter time periods than the standard photopolymerizable element.

Two factors which have an important bearing on this invention are the thickness of the photopolymerizable layer and the type of actinic radiation source used to photocondition the photopolymerizable element. It is essential that no polymerization of any portion of the photopolymerizable layer occur during photoconditioning or inferior printing plates will result. To prevent premature photopolymerization, the intensity of the actinic radiation and the wavelength should be selected to remove essentially all the aerial oxygen prior to the occurrence of polymerization. This can best be accomplished by using conditioning radiation of a wavelength that is not strongly absorbed by the photopolymerizable layer but has enough effect on the polymerization initiator to consume the polymerization-inhibiting oxygen at a faster rate than it can be replenished by diffusion through the air-exposed surface of the layer. The lower strata of the polymerizable layer receive a relatively high percentage of the incident radiation because the radiation is not strongly absorbed by the layer. Therefore, the photoconditioning process progresses in the lower strata as well as in the upper strata, though at a somewhat reduced rate. More uniform photoconditioning is accomplished as the amount of radiation absorbed by the layer decreases, but the photoconditioning is correspondingly slower. A limit is reached when the absorption of the radiation by the polymerizable layer is so low that the oxygen consumption becomes equal or slower than the oxygen replenishment by diffusion through the surface exposed to air.

It can be understood that a strongly absorbed radiation gives a more pronounced oxygen gradient than a weakly absorbed radiation because the intensity decreases more rapidly with the thickness penetrated by the radiation. The use of radiation of a wavelength that is not strongly absorbed, therefore, gives a more uniform conditioning of the photopolymerizable layer, but the exposure time necessary to achieve full conditioning becomes longer as the absorption decreases. In practice, the wavelength of the conditioning radiation should be such that only about 10 to 70%, preferably about 20 to 45%, of the incident radiation are absorbed by the layer. This can be accomplished by choosing a source that emits radiation of a suitable spectral composition or by the use of filters that eliminate part of the spectrum at the upper or the lower end of the region in which the photopolymerizable layer shows stronger absorption. Through it is possible to condition a layer with radiation of which only about 10% or less is absorbed, the time required to complete the conditioning becomes prohibitively long. It is therefore preferred to use radiation of such a wavelength that about 20 to 45% of the incident radiation are absorbed by the layer.

One method of photoconditioning a photopolymerizable layer is by intermittent exposure rather than by continuous exposure. By way of illustration, the conditioning exposure is made by using an 1800-watt, high-pressure mercury arc traveling at a uniform speed back and forth across the photopolymerizable layer. One passage of the arc requires 20 seconds, and, at each passage, every square inch of the photopolymerizable layer, respectively, of the filter surface, receives 1.75 watts of actinic radiation for a period of 0.7 second. The cumulative exposure therefore consists of a number of 0.7-second exposures, each followed by a 20-second dark period. This intermittent exposure has the advantage that a more uniform conditioning is obtained than by a continuous exposure. Before photoconditioning, the photopolymerizable layer is uniformly saturated with oxygen. During the first 0.7-second exposure, an oxygen gradient is established in the layer. In the upper strata the oxygen is consumed more rapidly than in the lower strata because the intensity of the radiation is higher in the upper strata. At the very surface of the layer, however, the oxygen consumption progresses more slowly than the oxygen replenishment from the surrounding air. Therefore, after one exposure, an oxygen minimum is established in the layer part way down from the surface. During the 20-second dark period, oxygen diffuses from the sites of higher concentration to the sites of low concentration, i.e., from the surface and from the bottom of the layer toward the site of lowest concentration. The result of this diffusion moves the oxygen minimum toward the surface of the layer. During the second light period, a further decrease of the oxygen level occurs; and during the following dark period, the oxygen gradient again tends to equalize and the oxygen minimum again moves toward the layer surface. The layer is conditioned when the oxygen level at the minimum point in the layer approaches a value at which polymerization begins.

Conditioning can also be accomplished with a continuous rather than an intermittent exposure. In this case, too, the use of a suitable filter is preferred. It is more difficult to achieve uniform conditioning with a continuous exposure because no equalization of the oxygen level can take place as it does during the dark periods of the intermittent exposure. Therefore, the intensity of the conditioning radiation must generally be lower for a continuous exposure, so that the upper strata of the layer do not reach the zero oxygen concentration and begin to polymerize before the lower strata are conditioned. A certain minimum level of radiation intensity must be maintained. Below this minimum, the oxygen replenishment by diffusion from the surface is equal to or greater than the oxygen consumption and no conditioning occurs.

All the factors, such as exposure time, wavelength, intensity, etc., vary with the composition and the thickness of the layer. Batch to batch variations of layers of identical composition can also occur and must be established by trial to gain the greatest benefit from this process.

It should be noted that even in a fully conditioned layer the very surface, down to the depth of about 3 to 4 mils, remains at a lower degree of conditioning than the rest of the layer. This is so because the diffusion of oxygen into this surface stratum occurs very rapidly, and the degree of conditioning regresses within seconds to a lower level. This has no effect on the plate quality, because during the imagewise exposure under vacuum this surface oxygen is consumed very rapidly. The lower degree of conditioning actually is advantageous in the preparation of halftone plates. It prevents "plugging" or filling-in of the tiny wells in the shadow areas which could easily occur if the layer were conditioned to the very surface.

A test to determine the amount of exposure useful for photoconditioning, in air, a photopolymerizable element having a given photopolymerizable layer thickness is as follows:

(1) A test strip of an air-saturated photopolymerizable element having a solid photopolymerizable layer (of the type described in the Plambeck, Martin, Munger, etc., patents listed above) e.g., 60 mils in thickness, is exposed in step-wise fashion, e.g., in 0.5-inch increments, the exposure increasing in an arithmetical progression. The unpolymerized areas of the test strip are removed by washing with a suitable solvent for the unpolymerized portion of the photopolymerizable layer, and the point where the first detectable polymerization occurs is noted, i.e., the point where the washout is incomplete. It is to be understood that if the time when the first detectable polymerization occurs is not accurately determined, a new test strip will have to be utilized.

(2) A wedge photopolymerizable element of the same composition as the element used in test (1), e.g., 2 inches in width and 6 inches long with a thickness range of up to 60 mils, supported by an inverse blank wedge to give a level surface is exposed in air to the same light source used above (1) for at least 70 percent but preferably 80 to 98 percent of the time required to cause the first detectable polymerization. The photoconditioned photopolymerizable layer is then placed in a vacuum frame and a combination line and halftone photographic negative is placed over the polymer layer. A vacuum is applied, and the photopolymerizable layer is exposed to an actinic radiation source for a period of time long enough to complete the imagewise plymerization of the photopolymerizable layer. The time selected for this exposure will ordinarily be the maximum that can be tolerated without causing overpolymerization of the surface and the resulting filling-in or "plugging" of small recesses in letters, halftone shadow dots, etc. The unexposed areas of the layer are removed by washing with a suitable solvent for the unpolymerized material. The element is examined and the maximum thickness where no undercutting of the relief images occurs is the maximum thickness of the layer that can be photo-conditioned by an actinic radiation source of that intensity. Radiation sources of less intensity can be used to photocondition the described element but, of course, take longer periods of time. Similar tests can be carried out in like manner with other radiation sources and the exposure determined for other photopolymerizable compositions.

A test similar to that described above can be used to determine the amount of exposure useful for photoconditioning a photopolymerizable element under conditions of reduced pressure, or wherein the photopolymerizable stratum is covered to exclude absorption of aerial oxygen.

The invention will be further illustrated by, but is not intended to be limited to, the following examples.

*Example I*

A photopolymerizable element was prepared by providing an adhesive-coated, 15-mil thick aluminum sheet with a layer 60 mils thick of a composition prepared from cellulose acetate hydrogen succinate (680 g.), triethylene glycol diacrylate (320 g.), anthraquinone (0.32 g.) and p-methoxyphenol (0.32) to form an element 75 mils in total thickness, all as described in Example 3 of assignee's Belgian Patent 580,820. The element having a solid photopolymerizable layer was stored in air for 24 hours after which a 1-inch by 12-inch segment was cut from the element. The segment was placed on a water-cooled aluminum plate (25° C.) beneath an 1800-watt high-pressure mercury arc traveling forth and back across the layer at a distance of 2.5 inches from the photopolymerizable surface, a filter (Corning type 3–75 Noviol Shade O which does not allow light of wavelengths below about 3700–3800 Angstroms to pass) having been placed between the polymer surface and the radiation source in such a manner that the photopolymerizable surface had ready access to air. The photopolymerizable segment was exposed stepwise, each ½-inch step for 0.7 second more than the previous step, in 20-second intervals. After 16.8 seconds' cumulative exposure (24 passes of the radiation source) the source was turned off, and the segment was spray-washed for approximately 7 minutes with a 0.04 N aqueous solution of NaOH. It was noticed that polymerization (incomplete washout) occurred after 10.5 seconds of cumulative irradiation (15 passes). To determine the thickness of the photopolymerizable layer which the above-described radiation source would photocondition, a wedged-shaped photopolymerizable element 2 inches in width and 6 inches long with a thickness ranging up to 60 mils and supported by an inverse blank wedge to give a level surface was exposed for 8.4 seconds (12 passes) in air to the traveling 1800-watt radiation source described above. A combination line and halftone photographic negative, the halftone areas containing a 120-line halftone screen (2-mil highlight dots), was placed on the surface of the photopolymerizable layer and the assembly was then placed in a vacuum frame. Vacuum was applied so that the negative was held in contact with the surface of the photopolymerizable layer and prevented air from reaching the surface. The photopolymerizable surface was then exposed with the 1800-watt radiation source described above to 1.75 watts of actinic radiation per square inch for 14 seconds of cumulative exposure. The unexposed areas were removed by spray-washing with a 0.04 N solution of NaOH and the images were examined. It was observed that good images were obtained with no undercutting of the relief images up to a photopolymerizable layer thickness of about 30 mils. At thicknesses greater than 30 mils, noticeable undercutting, i.e., washing away of the relief image base, was observed. The undercutting was severe at thicknesses of greater than 33 mils. A similar wedge-shaped photopolymerizable element, as described above in this example, was exposed in a similar manner but with no photoconditioning. Upon washout, severe undercutting was noticed at a thickness of about 10 mils.

*Example II*

Example I was repeated except that the filter placed between the solid photopolymerizable surface and the 1800-watt radiation source described in Example I was a Corning type 3–73 filter which is essentially opaque for radiation of wavelengths below about 400 A. The 1-inch by 12-inch photopolymerizable segment was exposed stepwise in 2.1-second increments (3 passes) for every ½-inch step. The first detectable polymerization after washout in a 0.04 N aqueous solution of NaOH was observed in 37.8 seconds' cumulative exposure (54 passes). A photopolymerization wedge similar to that described in Example I was prepared and exposed to the actinic radiation source described in Example I for 33.6 seconds' cumulative exposure (48 passes) as described in that example. The negative described in Example I was placed on the photopolymerizable surface, the assembly was placed in a vacuum frame and was exposed to 1.75 watts of actinic radiation per square inch for 14 seconds (cumulative exposure) as described in that example. After washing out the unpolymerized areas, no undercutting of the relief images was noticed until a thickness of 44 mils was reached. A control wedge-shaped element, exposed as described above and upon washout, was undercut severely at a 10 mils thickness.

*Example III*

Example I was repeated except that the radiation source utilized was a 40-watt, white fluorescent lamp. The photopolymerizable surface of the 1-inch by 12-inch segment was placed 3 inches from the light source; no filter was used. The photopolymerizable segment was exposed stepwise, ½ inch every 3.3 minutes. The first detectable polymerization was noticed after 60 minutes. A photopolymerizable wedge similar to that described in Example I was photoconditioned by exposing the surface to the fluorescent radiation source described above in this example for 53 minutes. The conditioned element, over which had been placed a halftone negative, was placed in a vacuum frame and was exposed by means of the 1800-watt actinic light source described in Example I to 1.75 watts of actinic radiation per square inch for 14 seconds (cumulative exposure). After removing the unexposed areas as described in Example I, no undercutting of the relief images was observed until a thickness of 53 mils was reached. A photopolymerizable wedge prepared as described in Example I which had received no photoconditioning was exposed through the negative to 1.75 watts of actinic radiation per square inch for 14 seconds (cumulative) using the 1800-watt actinic radiation source described in Example I. After removing the unexposed areas as described in Example I, undercutting of the relief images was noticed at thicknesses greater than 10 mils. This example illustrates that a photoconditioned element 53 mils thick can be exposed in the same amount of time required to expose a 10-mil unconditioned element.

*Example IV*

A photopolymerizable composition was prepared from 57 g. of cellulose acetate (degree of acetyl substitution 1.85), 23 g. of succinic anhydride, 40 g. of triethylene glycol diacrylate containing 0.1 percent by weight of anthraquinone and 0.1 percent by weight of p-methoxyphenol by the method described in Example I of Munger U.S. Patent 2,923,673. The composition was formed into a clear, transparent solid sheet 30 mills thick by pressing at 140° C. under a pressure of 300 pounds per square inch. The pressed sheet was laminated to a piece of steel 12 mils thick by means of the adhesive composition described in Example 5 of assignee's Belgian Patent 580,820, by placing the element in a laminating press for 3 minutes at 150° C. The resultant element was stored in air for 24 hours after which it was placed on a water-cooled aluminum plate (25° C.) beneath a traveling 1800-watt high-pressure mercury-arc, 2.5 inches from the photopolymerizable surface. A Corning type 3–75 filter was placed between the polymer surface and the radiation source so that the photopolymerizable surface had ready access to air. The element was exposed to actinic radiation from the described source for 6.3 seconds (cumulative). A combination line and halftone (120 lines/inch) photographic negative was placed on the surface of the photopolymerizable layer and the assembly was placed in a vacuum frame and vacuum was applied. The photopolymerizable surface was exposed with the 1800-watt radiation source described above (without the filter) to 1.75 watts of actinic radiation per square inch for 14 seconds (cumulative). The exposed element was removed from the vacuum frame, and the unexposed areas were removed by spray-washing with a 0.04 N aqueous solution of NaOH. It was observed that the image areas were of good quality with no undercutting of the images noted. The printing plate prepared showed excellent image quality and long press life when used for printing in a rotary press. A 30-mil thick control element which was not photoconditioned was exposed through the same negative in the manner described above in this example. Severe undercutting of the image areas was noticed upon washout at a depth of about 10 mils.

*Example V*

A photopolymerizable composition, prepared from the reactants described in Example IV, was formed into a clear, transparent, solid sheet about 44 mils thick as described in Example IV. A piece of steel, 12 mils thick, was coated with an adhesive composition prepared from a 37% solids mixture in methyl ethyl ketone, the solids consisting of 100 g. of a copolyester prepared from a reaction mixture of an excess of ethylene glycol and dimethyl hexahydroterephthalate, dimethyl sebacate and dimethyl terephthalate in a molar ratio of the latter three reactants of 8:1:1, respectively; 30 g. of triethylene glycol diacrylate containing 0.1% by weight of p-methoxyphenol and 3 g. of benzoyl peroxide. The adhesive also contained 0.6 g. of phenanthrenequinone which was thoroughly mixed into the adhesive solution. The photopolymerizable sheet was placed on the dried, adhesive-coated steel sheet and an element was prepared by laminating for 3 minutes in a press at 150° C. The photopolymerizable element, after storing in air for 24 hours, was placed on a water-cooled aluminum plate (25° C.) beneath an 1800-watt high-pressure mercury-arc, 2.5 inches from the photopolymerizable surface. A Corning type 3–75 filter was placed between the polymer surface and the radiation source as described in Example IV, and the element was exposed for 7 seconds (cumulative). After photoconditioning, the surface was exposed with the 1800-watt radiation source described above (without the filter) so that the photopolymerizable surface received an equivalent of 1.75 watts of actinic radiation per square inch for 18.2 seconds (cumulative) as described in Example IV and the unexposed areas were removed as described in that example. The image quality was satisfactory, no undercutting of the images being noted.

*Example VI*

Example V was repeated except that in place of the phenanthrenequinone 2.7 g. of uranyl nitrate initiator was added and mixed into the adhesive composition. The element prepared was phootconditioned as described in Example V for 11.9 seconds (cumulative) using the actinic radiation source and radiation filter described in that example. After photoconditioning, the photopolymerizable surface was exposed to 1.75 watts of actinic radiation per square inch for 29.4 seconds (cumulative) from the 1800-watt high-pressure mercury-arc. Results comparable to those described in Example V were obtained.

*Example VII*

A photopolymerizable composition prepared according to Example IV was formed into a clear, transparent, solid sheet about 42 mils thick and laminated to a steel plate 12 mils thick as described in Example IV. The element was placed in a vacuum frame, the pressure in the frame was reduced to 127 mm. of mercury and a Corning type 3–73 filter was placed over the vacuum frame. The filter cut out essentially all radiation of wavelengths shorter than 4000 A. The photopolymerizable composition had some sensitivity up to about 4300 A., but within the range of about 4000 to 4300 A., the layer was relatively transparent to the radiation. The optical density was from 0.25 to 0.17 which corresponds to a transmittance of 0.56 to 0.68, i.e., at the base of the layer the intensity measured 56 to 68% of the incident intensity (32 to 44% of the incident intensity was therefore absorbed in passing through the layer). A conditioning exposure was given through this filter by exposing the assembly to 1.75 watts of actinic radiation per square inch at the filter surface for 25 seconds of cumulative exposure, using the 1800-watt actinic radiation source described in Example I. The filter was then removed, the vacuum released and a combination line and halftone negative was placed in contact with the photopolymerizable layer. The vacuum was applied again and an image-forming exposure of 1.75 watts per square inch was administered for 14 seconds (cumulative), using the same radiation source as before but omitting the filter. The unexposed areas were removed by spray-washing with a 0.04 N solution of NaOH, a printing plate of good quality being obtained. No undercutting of the image was observed, whereas a similarly exposed, but non-conditioned element showed severe undercutting of the image.

By substituting in the foregoing examples, the photopolymerizable elements bearing solid photopolymerizable layers described in Martin and Barney U.S. Patent 2,927,022 or Plambeck U.S. Patent 2,791,504, similar results can be obtained.

Photopolymerizable elements bearing solid photopolymerizable layers which become inhibited by oxygen and can be treated in accordance with the invention can be made from addition polymerizable, ethylenically unsaturated compounds, i.e., the vinylidene monomers, particularly the vinyl monomers described in U.S. Patent 2,791,504, col. 17, line 62, to col. 18, line 16. Other addition-polymerizable ethylenically unsaturated compounds include acrylic or methacrylic acid esters of diethylene glycol, triethylene glycol and higher polyalkylene glycols, e.g., triethylene glycol diacrylate, methoxytriethylene glycol acrylate, ethylene glycol dimethacrylate, diethylene glycol dimethacrylate, triethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O—OCRCOOCH_2CH_2OCH_2CH_2OH$$

where R is a divalent hydrocarbon radical, e.g., methylene or ethylene. Other useful vinyl monomers include glycerol triacrylate, 1,2,4-butanetriol trimethacrylate and pentaerythritol tetramethacrylate.

With these addition polymerizable ethylenically unsaturated compounds various compatible binder materials or fillers may be present, e.g., (1) The N-methoxymethyl polyhexamethylene adipamide mixtures disclosed by assignee's Saner application Serial No. 577,829, filed April 12, 1956;

(2) The polyvinyl acetals having extralinear vinylidene groups disclosed in U.S. Patent 2,929,710, March 22, 1960;

(3) The polyester, polyacetal or mixed polyester acetal mixtures disclosed in U.S. Patent 2,892,716, June 30, 1959;

(4) The blends of selected organic-soluble, base-soluble cellulose derivatives with addition-polymerizable components and photoinitiators disclosed in U.S. Patent 2,927,022, March 1, 1960;

(5) The polyvinyl alcohol derivatives disclosed in U.S. Patent 2,902,365, September 1, 1959;

(6) The water-soluble cellulose ether and ester compositions disclosed in U.S. Patent 2,927,023, March 1, 1960;

In addition, a composition comprising cellulose acetate (60% by weight); triethylene glycol diacrylate (40% by weight); anthraquinone, photoinitiator (0.1% by weight based on the photopolymerizable material); and p-methoxyphenol thermal polymerization inhibitor (0.1% by weight based on the photopolymerizable material) may also be photoconditioned.

In the photopolymerizable elements treated in accordance with this invention there may be present any initiator of addition polymerization capable of initiating polymerization under the influence of actinic radiation. The preferred photoinitiators are not significantly activatable thermally at temperatures below 185° C. They should be dispersible in the photopolymerizable compositions to the extent necessary for initiating the desired polymerization under the influence of the amount of radiant energy absorbed in relatively short-term exposures. Suitable initiators are given in the patents mentioned above.

A preferred class of addition polymerization initiators activatable by actinic light and thermally inactive at and below 185° C. is a substituted or unsubstituted polynuclear quinone, which is a compound having two intracyclic carbonyl groups attached to intracyclic carbon atoms in a conjugated six-membered carbocyclic ring, there being at least one aromatic carbocyclic ring fused to the ring containing the carbonyl groups. Suitable such initators include 9,10-anthraquinone, 1-chloroanthraquinone, 2-chloranthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7, 8, 9,10-tetrahydronaphthacenequinone, and 1,2,3,4-tetrahydrobenz[a]anthracene-7,12-dione.

Suitable thermal polymerization inhibitors which preferably but not necessarily are used in the photopolymerizable composition include in addition to the preferred p-methoxyphenol, hydroquinone and alkyl and aryl-substituted hydroquinones, tert-butylcatechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B. (C.I. 52015) and Toluidine Blue O (C.I. 52040).

While the bases or supports for the photopolymerizable elements of this invention are preferably flexible and composed of metal, e.g., aluminum or steel, they can be rigid. Also, they can be made of various film-forming resins or polymers which can be transparent or opaque to the actinic radiation. Suitable supports of these types are disclosed in U.S. Patent 2,760,863, col. 5, lines 14 to 33. Various anchor layers, as disclosed in this patent, may be used to give strong adherence between the base and the photopolymerizable layer. The adhesive compositions disclosed in the assignee's Belgian Patent 580,820 are also very effective. The support or adhesive layer may have in or on its surface an antihalation layer as disclosed in U.S. 2,760,863.

It has been found that by adding an initiator, e.g., phenanthrenequinone, uranyl nitrate, etc., to the adhesive layer or placing it on a stratum below the photopolymerizable layer in contact with the layer, the time for photoconditioning can be decreased. Higher intensity radiation sources can be used than those useful for conditioning a photopolymerizable layer of equivalent thickness without the added initiator. It is believed that the initiator acts as a photooxygen sink which rapidly removes oxygen from the base of the photopolymerizable layer. The initiators are useful in quantities ranging from 0.1% by weight based on the weight of the adhesive layer up to their limit of solubility in the stratum in which they are placed. Excellent results are obtained with 0.5% by weight of phenanthrenequinone and 2.0% by weight of uranyl nitrate based on the weight of the dried adhesive layer.

Suitable actinic radiation sources useful in the invention include carbon arcs, mercury vapor arcs, fluorescent lamps with or without special ultraviolet-radiation-emitting phosphors, argon glow lamps, electronic flash units and photographic flood lamps. The radiation sources can be used at varying distances from the photopolymerizable layer, e.g., generally one-half to 10 inches and more, preferably 2 to 4 inches. Distances up to 40 inches are practical using the radiation sources of greater intensity because at the longer distances from the photopolymerizable layer the radiation source is less intense. Filters that do not transmit radiation of certain actinic wavelengths can also be placed between the radiation source and the photopolymerizable layer, e.g., Corning 3–75, 3–73, etc., filters, to reduce the intensity and filter out certain wavelengths of the activating radiation. The reduction of the amount of activating radiation is particularly important when the element is photoconditioned while under conditions of reduced pressure. As indicated above, care must be used in selecting the radiation source for a particular layer composition and thickness or polymerization of the layer may occur before the layer is conditioned. A radiation source useful for a particular layer thickness is useful for conditioning layers of less thickness, but the converse is not true.

A photopolymerizable element, as indicated above, can be photoconditioned under conditions of reduced partial pressure of oxygen, i.e., under vacuum conditions. Under these conditions, however, it has been found that the wavelengths of the photoconditioning radiation must be selected or controlled so that the radiation is not absorbed as strongly by the photopolymerizable layer as is the radiation of the wavelengths used for the subsequent image-forming exposure. Strong absorption of radiation during photoconditioning results in polymerization of the irradiated surface prior to complete photoconditioning of the photopolymerizable layer. Premature polymerization is due to slow conditioning in certain parts of the layer and from the lack of polymerization-inhibiting oxygen that is absorbed by the layer during the conditioning exposure. If the wavelengths emitted by an actinic radiation source are controlled, the amount of radiation absorbed by the photopolymerizable layer can be kept at a minimum. For example, by exposing a layer of a photopolymerizable composition with actinic radiation of a certain wavelength, only 20 percent of the radiation may be absorbed while passing through the layer. The degree of conditioning at the bottom surface of the layer would therefore lag 20 percent behind the degree of conditioning at the top surface because the consumption of oxygen by the photopolymerizable composition is proportional to the radiation intensity. Thus, when the layer surface is 99 percent depleted of oxygen, the base is 79 percent depleted. Such an oxygen level is adequate to give normal conditioning behavior. In practice, the conditioning does not take place in absolute absence of oxygen, but under reduced partial oxygen pressure. Therefore, some oxygen replenishment will take place at the layer surface so that the difference in degree of conditioning between top surface and bottom surface will generally be somewhat less than 20 percent. The amount of absorption of the actinic radiation that can be tolerated during photoconditioning varies with the particular photopolymerizable composition, the thickness of the layer, etc. A photopolymerizable layer, 40 mils in thickness, of the composition described in Example IV can absorb up to 44 percent of the incident radiation filtered as in Example VII. Satisfactory conditioning of the layer is obtained under partial vacuum. In Example VII a vacuum corresponding to 127 mm. residual air pressure, i.e., to about 25 mm. partial oxygen pressure, was applied. Therefore, some oxygen replenishment took place at the surface of the layer so that the conditioning at the bottom of the layer lagged somewhat less than 44% behind the conditioning at the surface.

After conditioning, it is preferred that the printing elements be exposed to actinic radiation, e.g., from the radiation sources described above, almost immediately to get the best image quality. It is possible to obtain satisfactory images, however, if the element is stored in air for about 1 hour or slightly more. Printing elements of 10 mils in thickness or more, after saturation with air, generally require conditioning. Below 10 mils in thickness, photoconditioning improves the photospeed of the printing element but is not essential to get satisfactory images.

This invention is useful in reducing to an acceptable level the undesirable oxygen that may be present in photopolymerizable printing elements, e.g., elements containing vinylidene and vinyl addition polymerizable ethylenically unsaturated compounds, preferably of the acrylic or alkacrylic ester type. The conditioned printing elements, upon exposure and subsequent washout, have excellent image quality.

The process of this invention provides photopolymerizable printing elements of maximum photospeed while also providing maximum protection against thermal polymerization which occurs slowly in the absence of oxygen. Proper conditioning also provides printing elements which are uniform with respect to photospeed and which can be converted reproducibly into high quality relief images. An additional advantage is that the process is simple and dependable.

What is claimed is:

1. In a process for the production of a relief image on a support which comprises imagewise exposure to actinic radiation of a photopolymerizable relief height-forming solid stratum coated on said support, said stratum comprising (1) a preformed, compatible, macromolecular polymer binding agent, (2) a non-gaseous, addition-polymerizable ethylenically unsaturated compound containing at least one terminal ethylenic group, having a molecular weight of less than 1500, a boiling point above 100° C. at normal atmospheric pressure and being capable of forming a high polymer by free-radical initiated, chain-propagating addition polymerization in the presence of an addition polymerization initiator therefor activatable by actinic radiation and (3) from 0.0001 to 10%, by weight, of the stratum of such an initiator; the improvement of reducing the inhibition caused by the presence of absorbed oxygen in said stratum, which improvement consists in: prior to said imagewise exposure, uniformly exposing a surface of said stratum to 70% to 98% of the amount of actinic radiation necessary to initiate photopolymerization therein.

2. A process according to claim 1 wherein the outer surface of said stratum, while having free uniform contact with the atmosphere, is exposed to said actinic radiation.

3. A process according to claim 1 wherein said support is transparent to the actinic radiation, said exposure being through the support.

4. A process according to claim 1 wherein said stratum is exposed while said element is under a partial vacuum.

5. A process according to claim 1 wherein said stratum is saturated with absorbed oxygen.

6. A process according to claim 1 wherein said components (1), (2) and (3) are present in amounts from 40 to 90, 10 to 60 and 0.0001 to 10.0 parts by weight, respectively.

7. A process according to claim 1 wherein said addition-polymerizable ethylenically unsaturated compound contains up to four terminal ethylenic groups.

8. A process according to claim 1 wherein between said support and relief height-forming solid stratum is a layer comprising an initiator for photopolymerization taken from the class consisting of phenanthrenequinone and uranyl nitrate.

9. A process according to claim 8 wherein said initiator is present in an amount of at least 0.1% by weight based on the weight of said layer.

10. A process according to claim 1 wherein the actinic radiation used for said uniformly exposing of said stratum is of such a wavelength that only about 10 to 70% of said radiation is absorbed by said stratum.

11. A process according to claim 10 wherein only about 20 to 45% of said radiation is absorbed by said stratum.

References Cited in the file of this patent

UNITED STATES PATENTS

| | | |
|---|---|---|
| 2,703,756 | Herrick et al. | Mar. 8, 1955 |
| 2,760,863 | Plambeck | Aug. 28, 1956 |
| 2,964,401 | Plambeck | Dec. 13, 1960 |

FOREIGN PATENTS

| | | |
|---|---|---|
| 860,165 | Great Britain | Feb. 1, 1961 |

OTHER REFERENCES

Derwent Belgian Patents Report, Abstract of Non-Delayed Belgian Patent Specifications Published May 16, 1960, between No. 586,645 to 587,090, volume sixty-five "B," volume issued June 25, 1960, page -A4-, Abstract of Belgian Patent 586,714. (Copy in Sci. Library.)